(12) United States Patent
Tashima et al.

(10) Patent No.: US 9,555,828 B2
(45) Date of Patent: Jan. 31, 2017

(54) ELECTRONIC CONTROL UNIT AND ELECTRIC POWER STEERING APPARATUS HAVING THE SAME

(71) Applicant: DENSO CORPORATION, Kariya, Aichi-pref. (JP)

(72) Inventors: Tsuyoshi Tashima, Kariya (JP);
Jyunichi Oogoshi, Kariya (JP);
Takayuki Uchida, Kariya (JP);
Katsuhiko Hayashi, Kariya (JP);
Shinsuke Oota, Kariya (JP)

(73) Assignee: DENSO CORPORATION, Kariya (JP)

( * ) Notice: Subject to any disclaimer, the term of this patent is extended or adjusted under 35 U.S.C. 154(b) by 56 days.

(21) Appl. No.: 14/582,877

(22) Filed: Dec. 24, 2014

(65) Prior Publication Data

US 2015/0189794 A1 Jul. 2, 2015

(30) Foreign Application Priority Data

Dec. 26, 2013 (JP) .................................. 2013-269233

(51) Int. Cl.
*H05K 7/20* (2006.01)
*B62D 5/04* (2006.01)
(Continued)

(52) U.S. Cl.
CPC ........... *B62D 5/0406* (2013.01); *H05K 1/0203* (2013.01); *H05K 7/1432* (2013.01);
(Continued)

(58) Field of Classification Search
CPC ............................ H05K 7/20854; H05K 7/209
See application file for complete search history.

(56) References Cited

U.S. PATENT DOCUMENTS 6,549,409 B1* 4/2003 Saxelby, Jr. ......... H05K 1/0203
165/185
6,724,631 B2* 4/2004 Ye ........................... H01L 23/36
257/707
(Continued)

FOREIGN PATENT DOCUMENTS

JP 2009-248864 10/2009
JP 2012-199354 10/2012

OTHER PUBLICATIONS

Office Action (2 pages) dated Jan. 26, 2016, issued in corresponding Japanese Application No. 2013-269233 and English translation (4 pages).

(Continued)

*Primary Examiner* — Robert J Hoffberg
(74) *Attorney, Agent, or Firm* — Nixon & Vanderhye PC

(57) ABSTRACT

In an electronic control unit, high-heat-generating devices are mounted on a first surface or a second surface of a board, a heat-dissipating member is located facing the first surface of the board, and a heat-conducting member is located between the board and the heat-dissipating member. The heat-conducting member is in contact with the high-heat-generating devices to transfer heat of the high-heat-generating devices to the heat-dissipating member. A ratio of the number of the high-heat-generating devices mounted on the board to the number of the high-heat-generating devices arranged inside a first limited region of the first surface or a second limited region of the second surface is greater than a predetermined ratio. The second limited region is located at a position corresponding to the first limited region.

11 Claims, 8 Drawing Sheets

(51) Int. Cl.
*H05K 1/02* (2006.01)
*H05K 7/14* (2006.01)
*H05K 1/18* (2006.01)

(52) U.S. Cl.
CPC ......... *H05K 7/20854* (2013.01); *H05K 1/181* (2013.01); *H05K 2201/09972* (2013.01)

(56) References Cited

U.S. PATENT DOCUMENTS

| | | | | |
|---|---|---|---|---|
| 7,310,233 B2* | 12/2007 | Bell | ................ | H05K 7/20509 |
| | | | | 165/185 |
| 7,375,974 B2* | 5/2008 | Kirigaya | ............. | H05K 1/0203 |
| | | | | 174/520 |
| 7,576,988 B2* | 8/2009 | Schwarz | ............ | H05K 7/20472 |
| | | | | 361/704 |
| 8,243,454 B2* | 8/2012 | Oota | ...................... | H01L 23/42 |
| | | | | 165/80.3 |
| 8,355,254 B2* | 1/2013 | Oota | ................... | B62D 5/0406 |
| | | | | 174/520 |
| 8,467,193 B2* | 6/2013 | Oota | ................ | H05K 7/20854 |
| | | | | 361/753 |
| 8,929,078 B2* | 1/2015 | Weeber | ................ | H01L 23/552 |
| | | | | 165/80.3 |
| 2009/0103267 A1* | 4/2009 | Wieland | ............ | H05K 7/20409 |
| | | | | 361/707 |
| 2011/0013365 A1* | 1/2011 | Oota | ................... | B62D 5/0406 |
| | | | | 361/707 |
| 2011/0013370 A1 | 1/2011 | Oota | | |
| 2012/0057318 A1 | 3/2012 | Oota | | |
| 2012/0326295 A1* | 12/2012 | Oota | ..................... | H01L 23/047 |
| | | | | 257/712 |
| 2015/0183456 A1* | 7/2015 | Nishimura | ............ | H05K 1/0203 |
| | | | | 318/139 |
| 2015/0189733 A1* | 7/2015 | Shibata | ................ | H05K 7/2039 |
| | | | | 701/41 |
| 2015/0189734 A1* | 7/2015 | Nishimoto | ............ | H05K 7/1432 |
| | | | | 701/41 |

OTHER PUBLICATIONS

Nishimura, U.S. Appl. No. 14/582,465, filed Dec. 24, 2014.
Nishimoto et al., U.S. Appl. No. 14/582,898, filed Dec. 24, 2014.
Shibata, U.S. Appl. No. 14/582,529, filed Dec. 24, 2014.

* cited by examiner

ELECTRONIC CONTROL UNIT AND ELECTRIC POWER STEERING APPARATUS HAVING THE SAME

CROSS REFERENCE TO RELATED APPLICATION

This application is based on and claims priority to Japanese Patent Application No. 2013-269233 filed on Dec. 26, 2013, the contents of which are incorporated herein by reference.

FIELD

The present disclosure relates to an electronic control unit for controlling a control target and an electric power steering apparatus having the electronic control unit.

BACKGROUND

An electronic control unit in which high-heat-generating devices, such as a switching device, a relay, a coil, and a capacitor, are mounted on a circuit board is known. The high-heat-generating device generates a lot of heat when operating. For example, in JP-A-2012-59759 corresponding to US 2012/0057318A1, a switching device, a relay, a coil, a capacitor, and a shunt resistor are mounted on the opposite side of a circuit board from a heat-dissipating member.

In the electronic control unit disclosed in JP-A-2012-59759, a heat-conducting member is located between the heat-dissipating member and part of a region where the switching device, the shunt resistor, and the capacitor are mounted. Accordingly, heat of the switching device, the shunt resistor, and the capacitor is transmitted to the heat-dissipating member through not only the heat-conducting member but also the circuit board. As a result, heat of the switching device, the shunt resistor, and the capacitor may be dissipated inefficiently.

The relay and the coil are mounted on a region separated from the region where the switching device, the shunt resistor, and the capacitor are mounted, so that the relay and the coil are located away from the heat-dissipating member. That is, JP-A-2012-59759 does not consider dissipating heat of the relay and the coil. Therefore, the electronic control unit may be heated by the heat of the relay and the coil.

In particular, the electronic control unit disclosed in JP-A-2012-59759 is used to control a motor of an electric power steering apparatus for a vehicle. When the motor of the electric power steering apparatus is driven and produces assisting-torque to help a driver to steer a vehicle, a large current flows through the motor and the high-heat-generating devices of the electronic control unit. Therefore, when the motor is driven, the high-heat-generating devices generate a lot of heat. For this reason, when an electronic control unit is used to control a motor of an electric power steering apparatus, it is preferable that heat of high-heat-generating devices of the electronic control unit should be dissipated efficiently.

SUMMARY

In view of the above, it is an object of the present disclosure to provide a small electronic control unit in which heat generated in a high-heat-generating device is highly efficiently dissipated and to provide an electric power steering apparatus having the electronic control unit.

According to an aspect of the present disclosure, an electronic control unit includes a board, high-heat-generating devices, a controller, a heat-dissipating member, and a heat-conducting member. The board has a first surface and a second surface opposite to the first surface. The high-heat-generating devices are mounted on the first surface or the second surface of the board and generate heat greater than a predetermined heat value when the electronic control unit operates. The controller controls a control target by controlling at least one of the high-heat-generating devices. The heat-dissipating member is located facing the first surface of the board. The heat-conducting member is located between the board and the heat-dissipating member and in contact with the high-heat-generating devices to transfer the heat of the high-heat-generating devices to the heat-dissipating member. A ratio of the total number of the high-heat-generating devices mounted on the board to the number of the high-heat-generating devices arranged inside a first limited region of the first surface or a second limited region of the second surface is greater than a predetermined ratio. The second limited region is located at a position corresponding to the first limited region.

BRIEF DESCRIPTION OF THE DRAWINGS

The above and other objects, features and advantages of the present disclosure will become more apparent from the following detailed description made with reference to the accompanying drawings. In the drawings.

DETAILED DESCRIPTION

Figure 1:
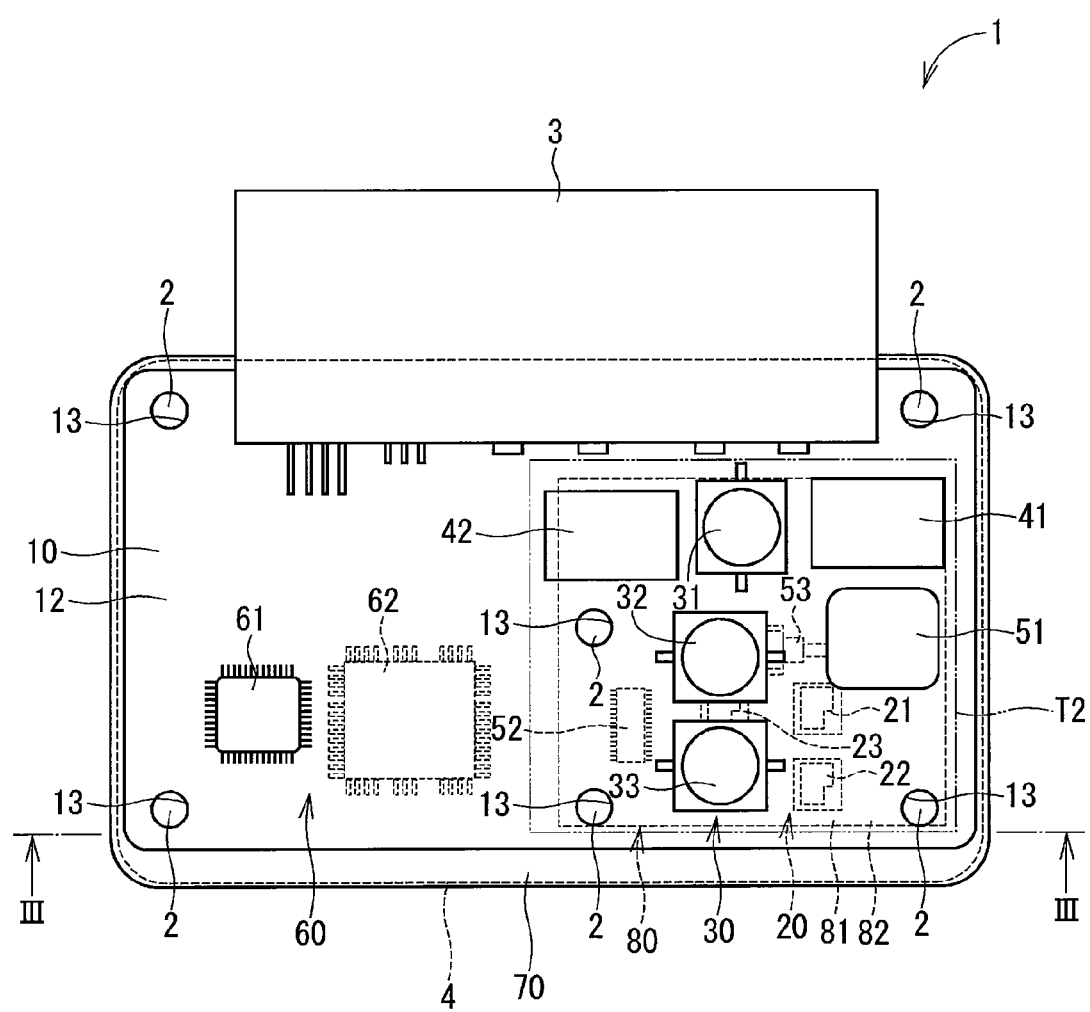
FIG. 1 is a diagram illustrating a top plan view of an electric control unit according to a first embodiment of the present disclosure.

Embodiments of the present disclosure are described below with reference to the drawings in which like characters of reference indicate the same or equivalent parts. For the sake of simplicity, a reference character may be assigned to only one of the same or equivalent parts in the drawings.

(First Embodiment)

Figure 2:
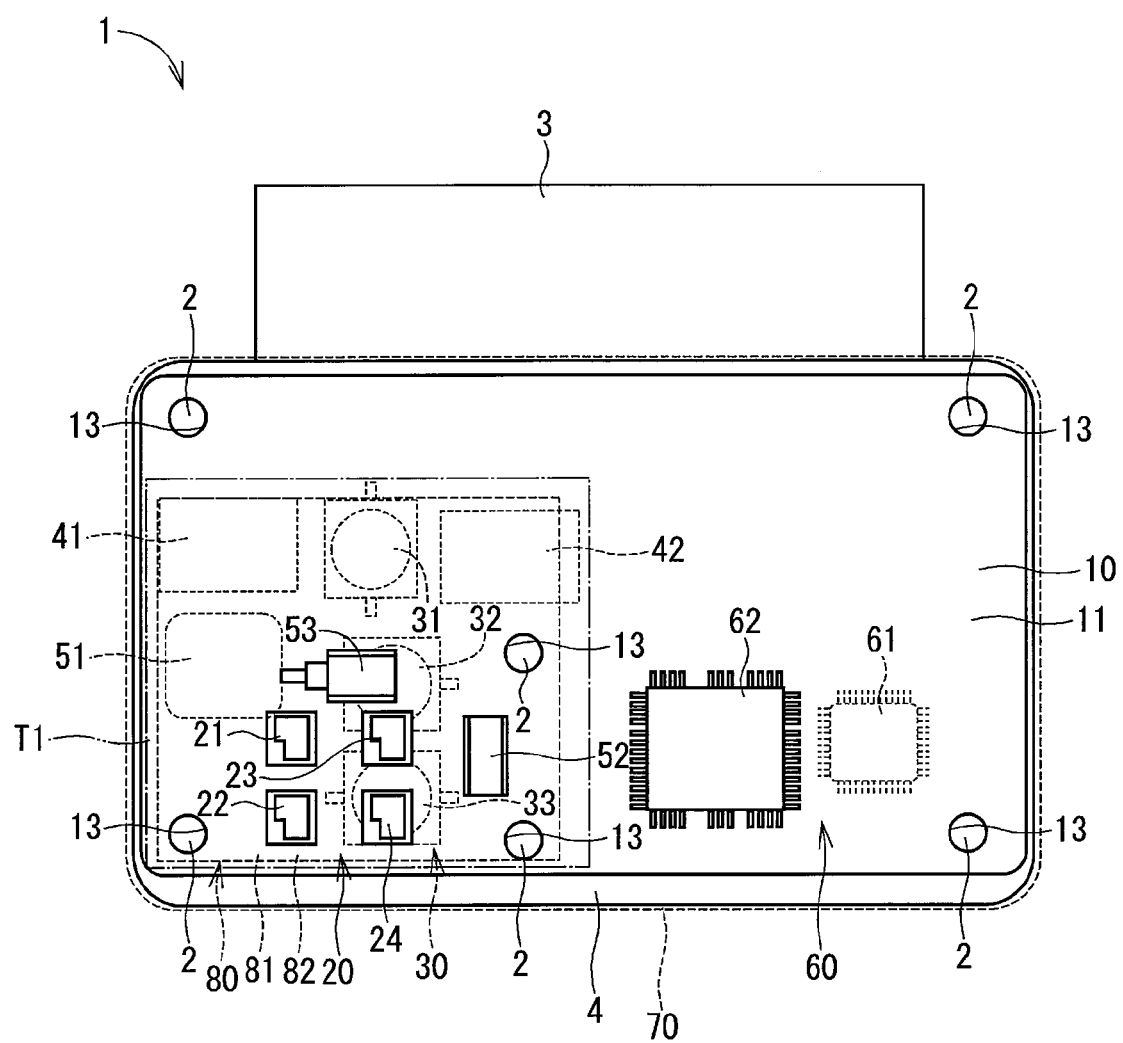
FIG. 2 is a diagram illustrating a bottom plan view of the electric control unit according to the first embodiment of the present disclosure.
Figure 3:
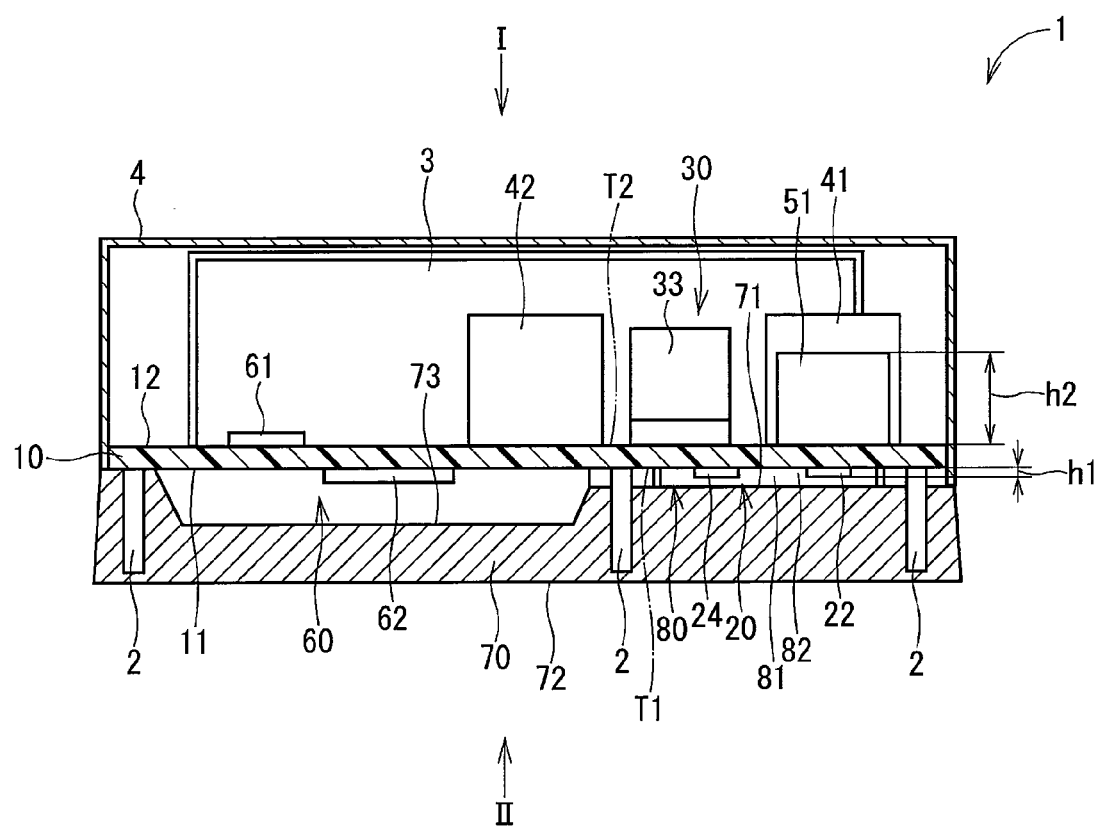
FIG. 3 is a diagram illustrating a cross-sectional view taken along line III-III in FIG. 1.
Figure 4:
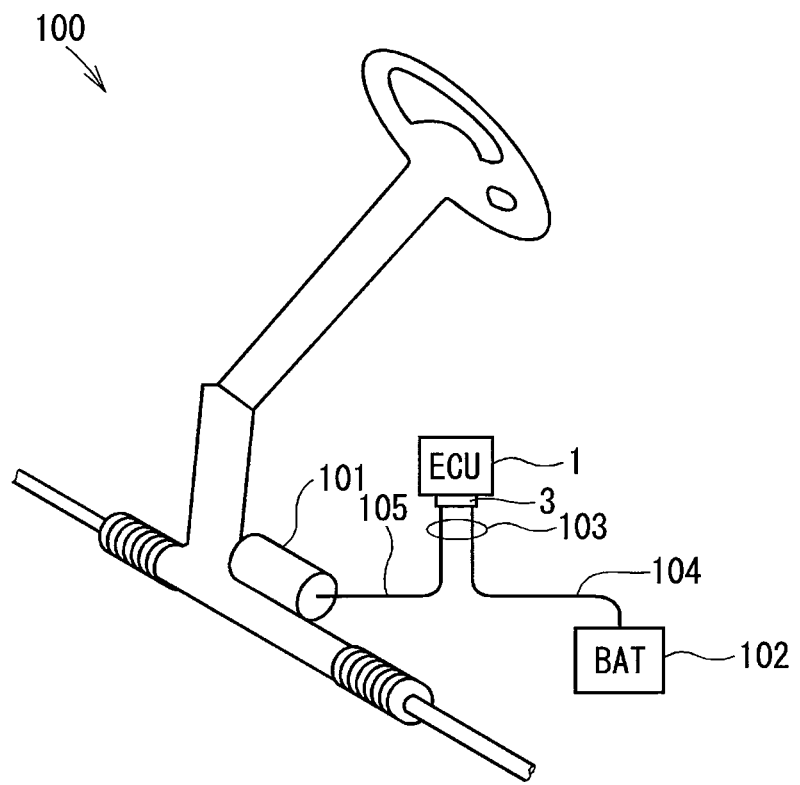
FIG. 4 is a diagram illustrating a structure of an electric power steering apparatus in which the electronic control unit according to the first embodiment of the present disclosure is used.

An electronic control unit 1 according to a first embodiment of the present embodiment is described below with reference to FIGS. 1-4. As shown in FIG. 4, the electronic control unit 1 is used in an electric power steering apparatus 100 of a vehicle. The electronic control unit 1 drives and controls a motor 101 based on a steering torque signal and a vehicle speed signal so that the motor 101 can produce assisting-torque to help a driver to steer the vehicle. The motor 101 corresponds to a control target recited in claims.

The electronic control unit 1 includes a circuit board 10, a switching device 20, a capacitor 30, relays 41 and 42, a coil 51, a shunt resistor 52, a power Zener diode 53, and a controller 60, a heatsink 70 serving as a heat-dissipating member, and a heat-conducting member 80.

The board 10 is a printed circuit board such as a FR4 (Flame Retardant Type 4) made of a glass woven fabric with epoxy resin. The board 10 is substantially rectangular.

The switching device 20 is a semiconductor device such as a metal-oxide-semiconductor field-effect transistor (MOSFET) and an insulated-gate bipolar transistor (IGBT). For example, as shown in FIGS. 2 and 3, the switching device 20 is shaped like a rectangular plate and mounted on a first surface 11 of the board 10 in such a manner that its surface direction is parallel to the first surface 11. According to the first embodiment, four switching devices 20 are mounted on the board 10. The four switching devices 20 are hereinafter sometimes collectively referred to as the "switching device 20" and also sometimes individually referred to as the "switching devices 21, 22, 23, and 24".

For example, as shown in FIGS. 1 and 3, the capacitor 30 is an aluminum electrolytic capacitor and shaped like a cylindrical column. The capacitor 30 is mounted on a second surface 12 of the board 10 opposite to the first surface 11 in such a manner that an axis of the capacitor 30 is perpendicular to the second surface 12. According to the first embodiment, three capacitors 30 are mounted on the board 10. The three capacitors 30 are hereinafter sometimes collectively referred to as to the "capacitor 30" and also sometimes individually referred to as the "capacitors 31, 32, and 33".

For example, as shown in FIGS. 1 and 3, the relays 41 and 42 are mechanical switches and shaped like a rectangular column. The relays 41 and 42 are mounted on the second surface 12 of the board 10 in such a manner that their height direction is perpendicular to the second surface 12.

For example, as shown in FIGS. 1 and 3, the coil 51 is a choke coil and has an outer shape like a rectangular column. The coil 51 is mounted on the second surface 12 of the board 10 in such a manner that its height direction is perpendicular to the second surface 12.

For example, as shown in FIG. 2, the shunt resister 52 is shaped like a rectangular plate and mounted on the first surface 11 of the board 10 in such a manner that its surface direction is parallel to the first surface 11.

For example, as shown in FIG. 2, the power Zener diode 53 is shaped like a rectangular plate and has a volume greater than a predetermined volume value. The power Zener diode 53 is mounted on the first surface 11 of the board 10 near the switching devices 21 and 23 in such a manner that its surface direction is perpendicular to the first surface 11.

The switching devices 21-24, the shunt resistor 52, and the power Zener diode 53 are collectively arranged inside a first limited region T1 of the first surface 11 of the board 10. The first limited region T1 is a region enclosed by a long dashed short dashed line in FIG. 2. In contrast, the capacitors 31-33, the relays 41, 42, and the coil 51 are collectively arranged inside a second limited region T2 of the second surface 12 of the board 10. The second limited region T2 is a region enclosed by a long dashed double-short dashed line in FIG. 1. The second limited region T2 is located at a position corresponding to the first limited region T1. Specifically, the second limited region T2 overlaps the first limited region T1 in a thickness direction of the board 10, i.e., in a direction perpendicular to the first and second surfaces 11 and 12 of the board 10. According to the first embodiment, as shown in FIGS. 1 and 2, the capacitors 32 and 33 are located directly opposite the switching devices 23 and 24 and the power Zener diode 53 across the board 10.

For example, the controller 60 includes a microcomputer 61 and a custom integrated circuit (IC) 62. For example, each of the microcomputer 61 and the custom IC 62 is a semiconductor package having a central processing unit (CPU), a read-only memory (ROM), a random access memory (RAM), and an input output (I/O) section. The controller 60 controls the relays 41, 42 and the switching devices 21-24. The controller 60 drives and controls the motor 101 by controlling the switching devices 21-24 based on signals from sensors mounted on the vehicle. According to the first embodiment, the motor 101 is a brushed DC motor.

As shown in FIG. 1, the microcomputer 61 is mounted on the second surface 12 of the board 10. According to the first embodiment, the microcomputer 61 is arranged outside the second limited region T2 of the second surface 12. In contrast, as shown in FIG. 2, the custom IC 62 is mounted on the first surface 11 of the board 10. According to the first embodiment, the custom IC 62 is arranged outside the first limited region T1 of the first surface 11.

Next, electrical connections among the switching devices 21-24, the capacitors 31-33, the relays 41, 42, the coil 51, the shunt resistor 52, the power Zener diode 53, and the controller 60 are described with reference to FIG. 5.

A positive terminal of a battery 102 serving as a power source of the vehicle is connected to the relay 41. The relay 41 is switched ON and OFF by the controller 60 so that supply of power from the battery 102 to the electronic control unit 1 can be allowed or stopped. Thus, the relay 41 acts as a power supply relay.

The power from the battery 102 is supplied to the switching devices 21-24 through the coil 51. The coil 51 eliminates noise from the power which is supplied from the battery 102 to the motor 101 through the electronic control unit 1.

An ignition power source 106 of the vehicle is connected to the controller 60 and anode between the relay 41 and the coil 51. The controller 60, i.e., the microcomputer 61 and the custom IC 62 operate on power from the ignition power source 106.

Figure 5:
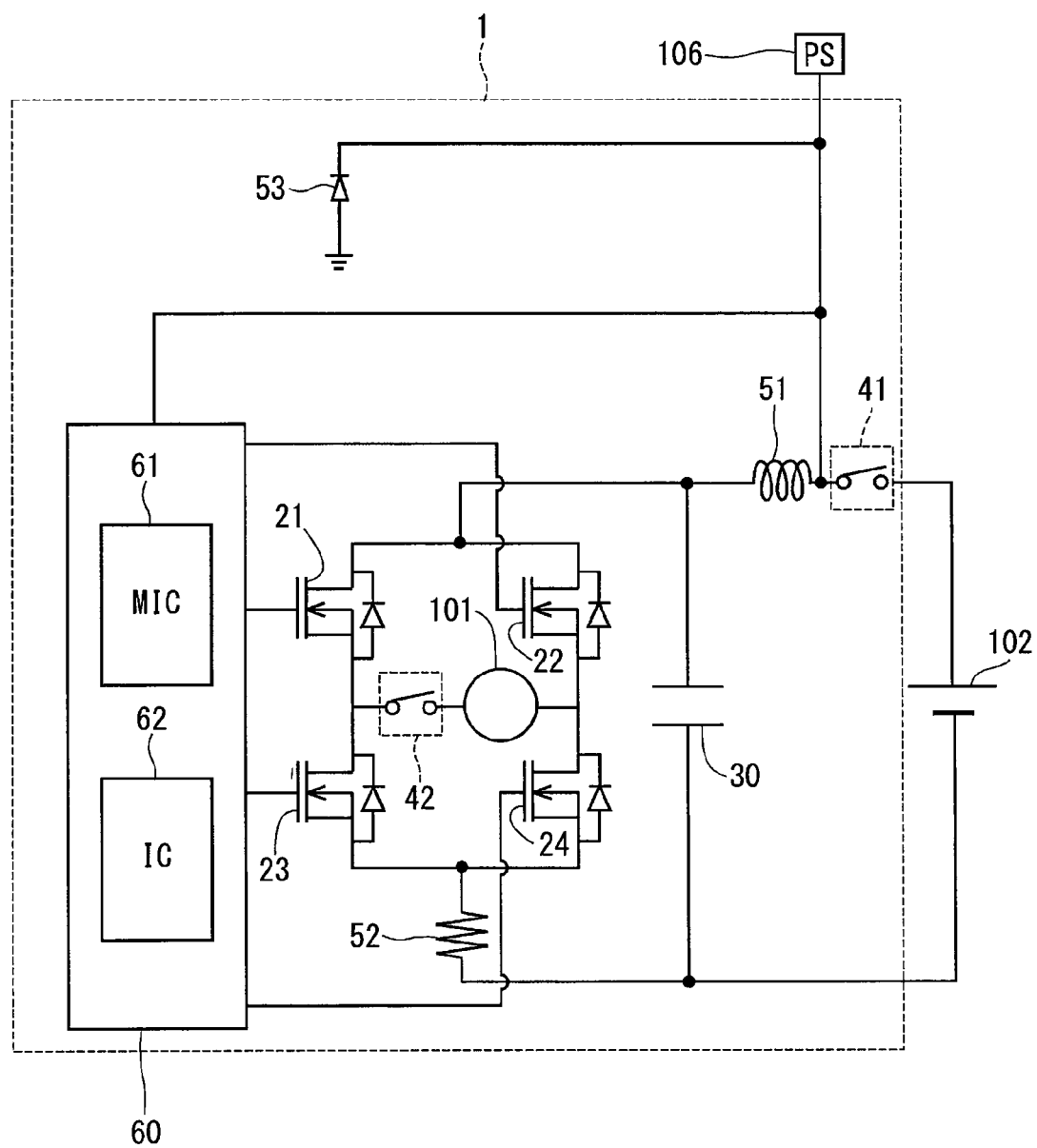
FIG. 5 is a diagram illustrating a circuit structure of the electric control unit according to the first embodiment of the present disclosure.

As shown in FIG. 5, the switching devices 21 and 23 are connected in series, and the switching devices 22 and 24 are connected in series. A series circuit of the switching devices 21 and 23 is connected in parallel to a series circuit of the switching devices 22 and 24.

The relay 42 and the motor 101 are connected between a node between the switching devices 21 and 23 and a node between the switching devices 22 and 24. In this way, the switching devices 21-24 are connected to form a H-bridge circuit. The shunt resistor 52 is connected to ground-side terminals of the switching devices 23 and 24. The capacitors 30 (31-33) are connected in parallel between a power supply line and a ground line. The capacitors 30 reduce a surge voltage occurring when the switching devices 21-24 are switched ON and OFF.

According to the above electrical connections, for example, when the switching devices 21 and 24 are ON, and the switching devices 22 and 23 are OFF, an electric current flows through the switching device 21, the relay 42, the motor 101, and the switching device 24 in the order mentioned. In contrast, when the switching devices 21 and 24 are OFF, and the switching devices 22 and 23 are ON, an electric current flows through the switching device 22, the motor 101, the relay 42, and the switching device 23 in the order mentioned. Since the motor 101 is a brushed DC motor, the motor 101 is driven and rotates when the switching devices 21-24 of the H-bridge circuit are switched ON and OFF in the above manner. Signal lines from the custom IC 62 of the controller 60 are separately connected to the switching devices 21-24 so that the controller 60 can control the switching of the switching devices 21-24. Thus, the controller 60 drives and controls the motor 101 by controlling the switching of the switching devices 21-24. Since the controller 60 controls the switching devices 21-24 based on an electric current detected by the shunt resistor 52, the controller 60 can accurately control the switching devices 21-24, and by extension, the motor 101.

The relay 42 is switched ON and OFF by the controller 60 so that supply of power from the battery 102 to the motor 101 can be allowed or stopped. Thus, the relay 42 acts as a motor relay.

A relatively large current flows through the switching device 20, the capacitor 30, the relays 41, 42, the coil 51, and the shunt resistor 52 during the switching of the switching device 20. Therefore, when the electronic control unit 1 operates, the switching device 20, the capacitor 30, the relays 41, 42, the coil 51, and the shunt resistor 52 generate heat greater than a predetermined value, and their temperatures become relatively high. Each of the switching device 20, the capacitor 30, the relays 41, 42, the coil 51, and the shunt resistor 52 corresponds to a high-heat-generating device recited in claims.

One end of the power Zener diode 53 is connected to the ignition power source 106, the controller 60, and the node between the relay 41 and the coil 51. The other end of the power Zener diode 53 is connected to a ground.

In normal times where the power supplied from the ignition power source 106 to the electronic control unit 1 is not larger than a predetermined threshold, the power Zener diode 53 prevents an electric current from flowing from the ignition power source 106 to the ground through it. In contrast, when the power supplied from the ignition power source 106 to the electronic control unit 1 is larger than the threshold, the power Zener diode 53 allows an electric current to flow from the ignition power source 106 to the ground through it. Thus, the power Zener diode 53 prevents a large current from flowing from the ignition power source 106 to the electronic control unit 1 (in particular, the controller 60), thereby protecting the electronic control unit 1.

As described above, in normal times, the power Zener diode 53 does not pass an electric current. That is, when the electronic control unit 1 operates, the power Zener diode 53 does not generate heat greater than the predetermined value. The power Zener diode 53 corresponds to a low-heat-generating device recited in claims.

The power Zener diode 53 is arranged near the switching device 20 and serves as a heat mass/capacity member. Therefore, during the switching of the switching device 20, part of the heat of the switching device 20 is transmitted to the power Zener diode 53, and a temperature of the power Zener diode 53 is increased accordingly.

According to the first embodiment, the switching device 20, the capacitor 30, the relays 41, 42, the coil 51, the shunt resistor 52, and the power Zener diode 53 are so-called surface-mount devices (SMDs).

The heatsink 70 is made of a metal such as aluminum. For example, as shown in FIGS. 1 and 3, the heatsink 70 is shaped like a rectangular plate and has first and second surfaces 71 and 72 opposite to each other. The heatsink 70 is mounted on the board 10 in such a manner that the first surface 71 faces the first surface 11 of the board 10.

The electronic control unit 1 further has fasteners 2. For example, the fasteners 2 are made of a metal such as aluminum. According to the first embodiment, the fasteners 2 are screws. The board 10 has insertion holes 13 which penetrate the board 10 at predetermined positions in the thickness direction of the board 10. Screw holes are formed in the first surface 71 of the heatsink 70. The fasteners 2 are inserted through the insertion holes 13 of the board 10 and screwed into the screw holes of the heatsink 70 so that the fasteners 2 can be joined to the heatsink 70. Thus, the board 10 and the heatsink 70 are fixed to each other in such a manner that the first surface 11 of the board 10 can be spaced from the first surface 71 of the heatsink 70 by a predetermined distance.

For example, the heat-conducting member 80 includes an electrically-insulating, heat-dissipating sheet 81 and a heat-dissipating grease 82. For example, the heat-dissipating sheet 81 is an electrically-insulating sheet containing silicon and having a low thermal resistance. For example, the heat-dissipating grease 82 is a gel of grease mainly containing silicon and having a low thermal resistance.

The heat-conducting member 80 is located between the first surface 11 of the board 10 and the first surface 71 of the heatsink 70 and in contact with the switching device 20, the shunt resistor 52, the power Zener diode 53, and the heatsink 70. Thus, the heat-conducting member 80 transfers the heat of the switching device 20, the shunt resistor 52, and the power Zener diode 53 to the heatsink 70. It is noted that the heat-conducting member 80 is located inside the first limited region T1.

Further, as shown in FIG. 3, the heat-conducting member 80 is in contact with both the first surface 11 of the board 10 and the first surface 71 of the heatsink 70. Thus, the heat-conducting member 80 transfers the heat, which is transmitted to the board 10 from the switching device 20, the shunt resistor 52, the power Zener diode 53, the capacitor 30, the relays 41, 42, and the coil 51, to the heatsink 70.

According to the first embodiment, multiple heat-conducting members 80 are provided at positions corresponding to the switching device 20, the shunt resistor 52, the power Zener diode 53, the capacitor 30, the relays 41, 42, and the coil 51 and integrated together as one heat-conducting member 80. For this reason, in the drawings, the heat-conducting members 80 apparently look like one heat-conducting member 80.

A height of the switching device 20 from the first surface 11 of the board 10 is equal to or less than a predetermined height value h1. Likewise, heights of the shunt resistor 52 and the power Zener diode 53 from the first surface 11 of the board 10 are equal to or less than the predetermined height value h1. Accordingly, the first surface 11 of the board 10 can be located as close as possible to the first surface 71 of the heatsink 70.

In contrast, a height of the coil 51 from the second surface 12 of the board 10 is equal to or greater than a predetermined height value h2. Likewise, heights of the capacitor 30 and the relays 41, 42 from the second surface 12 of the board 10 are equal to or greater than the predetermined height value h2.

In the heatsink 70, the first surface 71 is partially recessed toward the second surface 72 so that a recess 73 can be formed. The recess 73 is located outside the first limited region T1. The controller 60 is located at a position corresponding to the recess 73.

As shown in FIGS. 2 and 3, the electronic control unit 1 further includes a cover 4. The cover 4 is mounted on the opposite side of the board 10 from the heatsink 70. For example, the cover 4 is made of a metal such as aluminum and shaped like a box. The cover 4 covers the second surface 12 side of the board 10, and an outer edge of the cover 4 is connected to an outer edge of the heatsink 70. Since the second surface 12 side of the board 10 is covered with the cover 4, the capacitor 30, the relays 41, 42, the coil 51, and the microcomputer 61, which are mounted on the second surface 12 of the board 10, can be protected from external force, water, dust, etc. Further, since the first surface 11 side of the board 10 is covered with the heatsink 70, the switching device 20, the shunt resistor 52, the power Zener diode 53, and the custom IC 62, which are mounted on the first surface 11 of the board 10, can be protected from external force, water, dust, etc.

The electronic control unit 1 further includes a connector 3. As shown in FIG. 1, the connector 3 is mounted on an outer edge of the board 10 and exposed outside the cover 4. For example, the connector 3 has a rectangular tube-shaped housing made of resin and multiple terminals, including a PIG terminal (i.e., power supply terminal or positive side terminal), a ground terminal, and a motor terminal, provided in the housing. As shown in FIG. 4, the connector 3 is connected to a harness 103. A wire 104 of the harness 103 electrically connects the positive terminal of the battery 102 to the PIG terminal of the connector 3. Although not shown in the drawings, the PIG terminal is connected to a positive-side terminal of the relay 41. A wire 105 of the harness 103 electrically connects a winding terminal of the motor 101 to the motor terminal of the connector 3.

Next, operations of the electronic control unit 1 are described.

When a driver of the vehicle turns ON an ignition switch of the vehicle, power is supplied to the electronic control unit 1 from the ignition power source 106, and the electronic control unit 1 is activated. When the electronic control unit 1 is activated, the controller 60 turns ON the relays 41 and 42. Accordingly, supply of the power from the battery 102 to the motor 101 is allowed.

During an ON-period of the ignition switch, the controller 60 drives and controls the motor 101 by controlling the switching of the switching device 20 based on the steering torque signal and the vehicle speed signal. Accordingly, the motor 101 produces assisting-torque to help the driver to steer the vehicle.

When the controller 60 drives and controls the motor 101 by controlling the switching of the switching device 20, a relatively large current flows through the switching device 20, the capacitor 30, the relays 41, 42, the coil 51, and the shunt resistor 52. Accordingly, the switching device 20, the capacitor 30, the relays 41, 42, the coil 51, and the shunt resistor 52 generate heat, and their temperatures become relatively high.

The heat of the switching device 20, the shunt resistor 52, and the power Zener diode 53 is transferred to the heatsink 70 through the heat-conducting member 80.

Further, the heat of the capacitor 30, the relays 41, 42, and the coil 51 in addition to the switching device 20, the shunt resistor 52, and the power Zener diode 53 is transferred to the heatsink 70 through the board 10 and the heat-conducting member 80 which is in contact with the board 10 and the heatsink 70.

Thus, when the electronic control unit 1 operates, the heat of the switching device 20, the shunt resistor 52, the power Zener diode 53, the capacitor 30, the relays 41, 42, and the coil 51 is transferred to the heatsink 70 efficiently.

In summary, the first embodiment can have the following features (1)-(11).

(1) The switching device 20, the capacitor 30, the relays 41, 42, the coil 51, and the shunt resistor 52, where are defined as high-heat-generating devices, are mounted on the first surface 11 or the second surface 12 of the board 10 and generate heat greater than a predetermined value when the electronic control unit 1 operates. The controller 60 controls the motor 101 by controlling the switching device 20.

The heatsink 70 is mounted on the board 10 in such a manner that the first surface 71 of the heatsink 70 faces the first surface 11 of the board 10. The heat-conducting member 80 is located between the board 10 and the heatsink 70 and in contact with at least the switching device 20, the shunt resistor 52, and the heatsink 70. Thus, the heat-conducting member 80 transfers the heat of the switching device 20 and the shunt resistor 52 to the heatsink 70.

The switching device 20 and the shunt resistor 52 are arranged inside the first limited region T1 of the first surface 11 of the board 10. In contrast, the capacitor 30, the relays 41, 42, and the coil 51 are arranged inside the second limited region T2 of the second surface 12 of the board 10. The second limited region T2 is located at the position corresponding to the first limited region T1. Thus, all the high-heat-generating devices mounted on the board 10 are collectively arranged inside the first limited region T1 or the second limited region T2. In other words, a ratio of the number of all the high-heat-generating devices mounted on the board 10 to the number of the high-heat-generating devices arranged inside the first limited region T1 or the second limited region T2 is equal to or greater than a predetermined value. In such an approach, the heat of the switching device 20, the shunt resistor 52, the capacitor 30, the relays 41, 42, and the coil 51 can be efficiently transferred to the heatsink 70 through the same heat-conducting path (i.e., heat-conducting member 80).

Further, since all the high-heat-generating devices are collectively arranged inside the first limited region T1 or the second limited region T2, the high-heat-generating devices can be mounted on the board 10 with high density. Accordingly, the board 10, and by extension, the electronic control unit 1 can be reduced in size.

Further, since the switching device 20 and the shunt resistor 52 out of the high-heat-generating devices are mounted on the first surface 11 of the board 10, the switching device 20 and the shunt resistor 52 are located close to the first surface 71 of the heatsink 70 so that the heat of the switching device 20 and the shunt resistor 52 can be efficiently dissipated to the heatsink 70.

Further, the capacitor 30, the relays 41, 42, and the coil 51 out of the high-heat-generating device are mounted on the second surface 12 of the board 10 and arranged inside the second limited region T2 which is located at the position corresponding to the first limited region T1 where the switching device 20 and the shunt resistor 52 are arranged. Thus, a length of a heat-dissipating path, through which the heat of the capacitor 30, the relays 41, 42, and the coil 51 is dissipated to the heatsink 70 via the board 10 and the heat-conducting member 80, can be reduced compared to when the capacitor 30, the relays 41, 42, and the coil 51 are arranged outside the second limited region T2. Accordingly, the heat of the capacitor 30, the relays 41, 42, and the coil 51 mounted on the second surface 12 of the board 10 can be efficiently dissipated.

(2) The heat-conducting member 80 is in contact with the board 10 and the heatsink 70. Thus, the heat of the switching device 20, the shunt resistor 52, the capacitor 30, the relays 41, 42, and the coil 51 can be efficiently transferred to the heatsink 70 through the board 10 and the heat-conducting member 80.

(3) Multiple heat-conducting members 80 are provided at positions corresponding to the switching device 20, the shunt resistor 52, the capacitor 30, the relays 41, 42, and the coil 51. Thus, the heat of the switching device 20, the shunt resistor 52, the capacitor 30, the relays 41, 42, and the coil 51 can be transferred to the heatsink 70 through the respective heat-conducting members 80.

(4) The heat-conducting members 80 are integrated together as one heat-conducting member 80 and apparently look like one heat-conducting member 80. Therefore, the heat-conducting member 80 can be easily adhered or applied between the board 10 and the heatsink 70.

Since all the high-heat-generating devices mounted on the board 10 are collectively arranged inside the first limited region T1 or the second limited region T2, the heat-conducting members 80 can be integrated together as one heat-conducting member 80 as described above. That is, there is no need that the heat-conducting members 80 are separately provided at positions corresponding to the switching device 20, the shunt resistor 52, the capacitor 30, the relays 41, 42, and the coil 51.

(5) The controller 60 is arranged outside the first limited region T1 of the first surface 11 and the second limited region T2 of the second surface 12 of the board 10. Thus, transmission of the heat of the high-heat-generating devices, which are arranged inside the first limited region T1 or the second limited region T2, to the controller 60 can be reduced. Thus, malfunction of the controller 60 due to the heat of the high-heat-generating devices can be prevented.

(6) The heights of the switching device 20 and the shunt resistor 52, out of the high-heat-generating devices arranged inside the first limited region T1 of the first surface 11 of the board 10, from the first surface 11 are equal to or less than the predetermined height value h1. Thus, the first surface 11 of the board 10 can be located as close as possible to the first surface 71 of the heatsink 70. Accordingly, the heat of the switching device 20, the shunt resistor 52, the capacitor 30, the relays 41, 42, and the coil 51 can be efficiently transferred to the heatsink 70 through the board 10.

(7) The switching device 20 and the shunt resistor 52 are shaped like a plate so that their surface direction can be parallel to the first surface 11 of the board 10. Thus, the heights of the switching device 20 and the shunt resistor 52 from the first surface 11 of the board 10 can be made as small as possible while the area of the switching device 20 and the shunt resistor 52 facing the heatsink 70 can be made as large as possible. Accordingly, the heat of the switching device 20 and the shunt resistor 52 can be transferred to the heatsink 70 more efficiently.

(8) The switching device 20, the capacitor 30, the relays 41, 42, the coil 51, and the shunt resistor 52 are specific examples of a high-heat-generating device which generates heat greater than a predetermined heat value when the electronic control unit 1 operates.

(9) The electronic control unit 1 further includes the power Zener diode 53 whose volume is greater than a predetermined volume value. The power Zener diode 53 is mounted near the switching device 20 on the board 10 and generates heat not greater than the predetermined heat value. The power Zener diode 53 serves as a heat mass/capacity member, and part of the heat of the switching device 20 is transmitted to the power Zener diode 53. Thus, the heat of the switching device 20 is transferred to the heatsink 70 through the power Zener diode 53 and the heat-conducting member 80.

(10) The power Zener diode 53 is a specific example of a low-heat-generating device which has a volume greater than the predetermined volume value and generates heat not greater than the predetermined heat value when the electronic control unit 1 operates.

(11) The electric power steering apparatus 100 includes the electronic control unit 1 and the motor 101. The motor 101 is controlled by the electronic control unit 1 so that the motor 101 can produce assisting-torque to help the driver to steer the vehicle.

A large amount of heat is generated in the electric power steering apparatus 100 due to a large current flowing in it, and the electric power steering apparatus 100 needs to be small enough to be installed in a limited space of the vehicle. Due to its small size and high heat dissipation efficiency, the electronic control unit 1 can be suitably used in the electric power steering apparatus 100.

(Second Embodiment)

Figure 6:
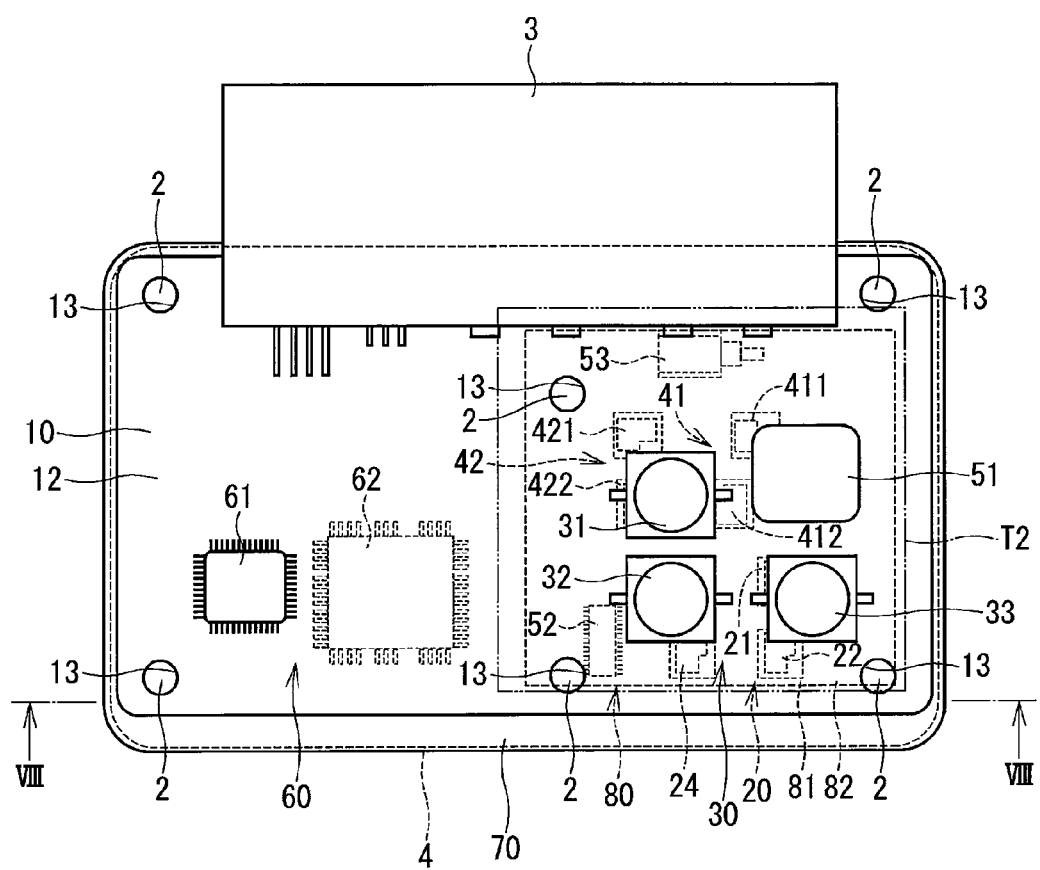
FIG. 6 is a diagram illustrating a top plan view of an electric control unit according to a second embodiment of the present disclosure.

An electronic control unit 1 according to a second embodiment of the present disclosure is described below with reference to FIGS. 6-8. The second embodiment differs from the first embodiment in the relays 41, 42.

According to the second embodiment, the relay 41 includes switching devices 411 and 412. Like the switching device 20, each of the switching devices 411 and 412 is a semiconductor device such as a MOSFET and an IGBT. For example, as shown in FIGS. 7 and 8, the switching devices 411 and 412 are shaped like a rectangular plate and mounted inside the first limited region T1 of the first surface 11 of the board 10 in such a manner that their surface direction can be parallel to the first surface 11.

The relay 41 (i.e., the switching devices 411 and 412) is switched ON and OFF by the controller 60 so that supply of power from the battery 102 to the electronic control unit 1 can be allowed or stopped.

The relay 42 includes switching devices 421 and 422. Like the switching devices 411 and 412, each of the switching devices 421 and 422 is a semiconductor device such as a MOSFET and an IGBT. For example, as shown in FIGS. 7 and 8, the switching devices 421 and 422 are shaped like a rectangular plate and mounted inside the first limited region T1 of the first surface 11 of the board 10 in such a manner that their surface direction can be parallel to the first surface 11. The relays 41 and 42 are located close to each other.

The relay 42 (i.e., the switching devices 421 and 422) is switched ON and OFF by the controller 60 so that supply of power from the battery 102 to the electronic control unit 1 can be allowed or stopped.

As described above, the relays 41 and 42 are semiconductor switches, unlike in the first embodiment where they are mechanical switches.

Further, the relays 41 and 42 are mounted inside the first limited region T1 of the first surface 11 of the board 10, unlike in the first embodiment where they are mounted within the second limited region T2 of the second surface 12 of the board 10.

Figure 8:
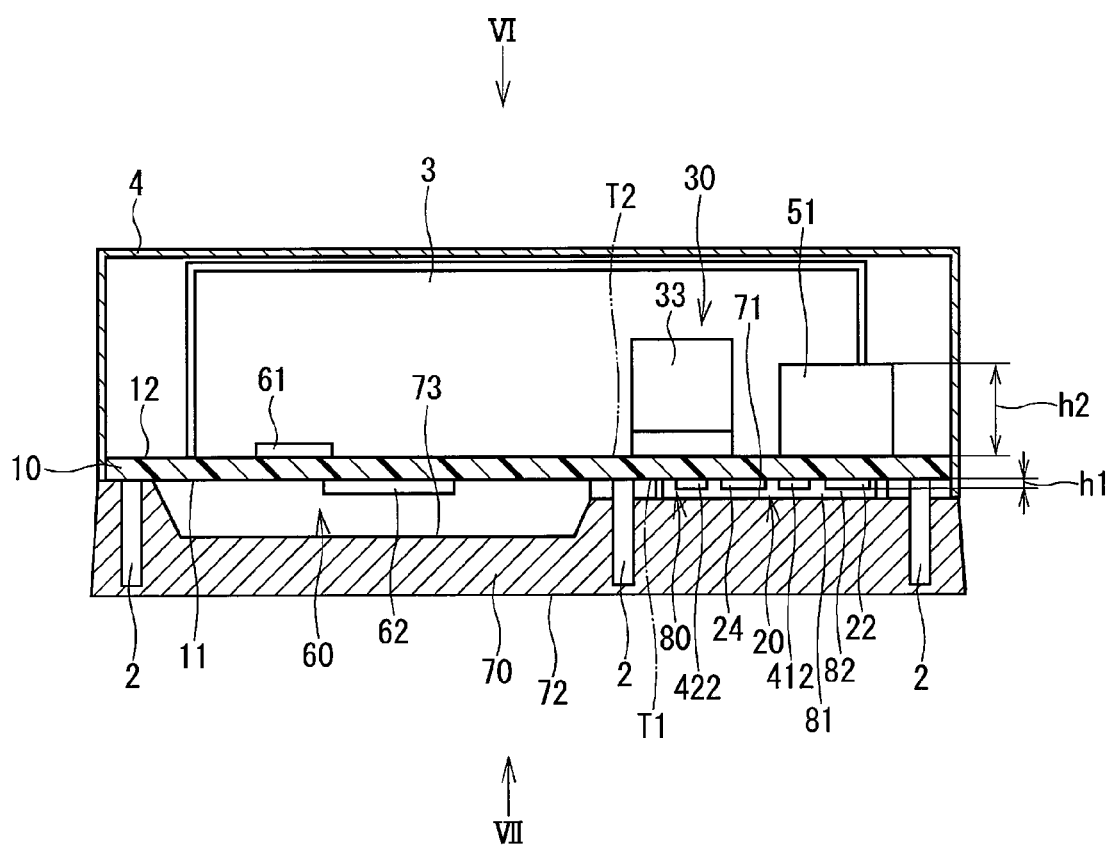
FIG. 8 is a diagram illustrating a cross-sectional view taken along line VIII-VIII in FIG. 6.

As shown in FIG. 8, heights of the switching devices 411, 412, 421, and 422 from the first surface 11 of the board 10 are equal to or less than the predetermined height value h1. The heights of the coil 51 and the capacitor 30 from the second surface 12 of the board 10 are equal to or greater than the predetermined height value h2.

Figure 7:
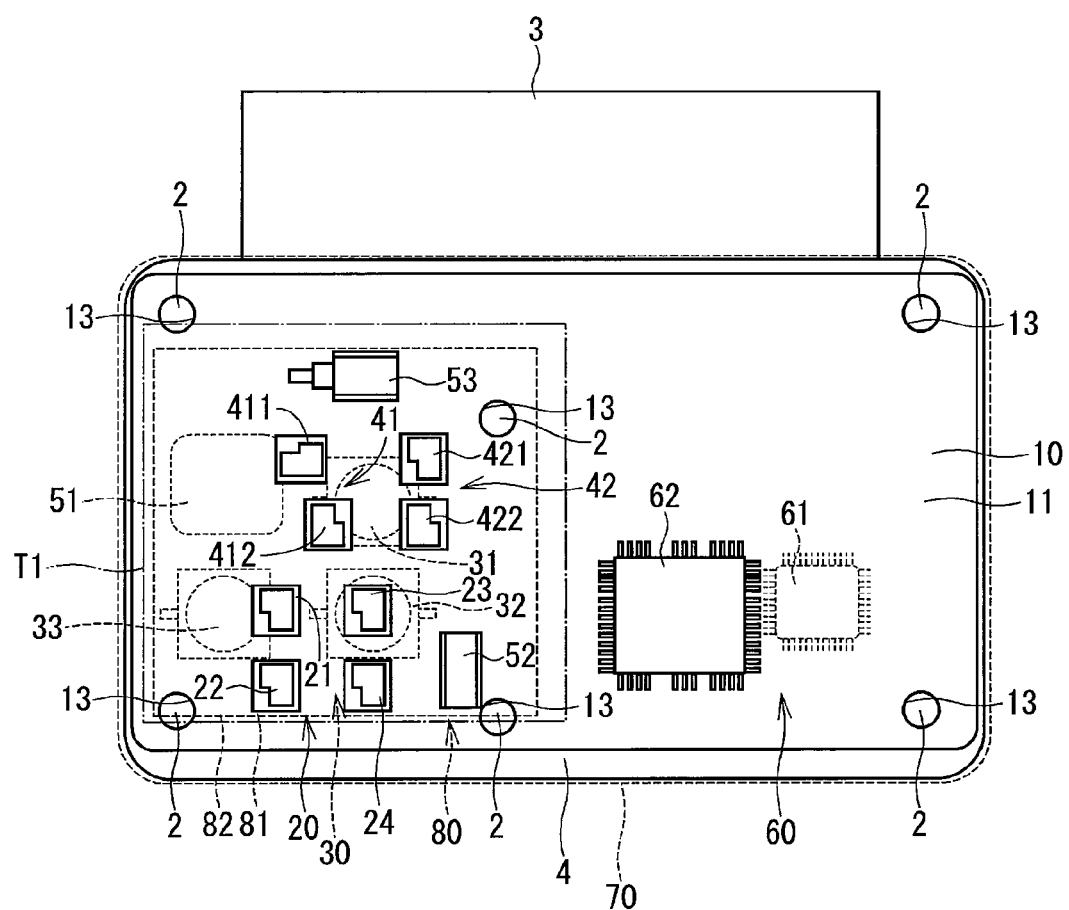
FIG. 7 is a diagram illustrating a bottom plan view of the electric control unit according to the second embodiment of the present disclosure.

As shown in FIG. 7, according to the second embodiment, the power Zener diode 53 is mounted inside the first limited region T1 of the first surface 11 of the board 10 and located near the relays 41 and 42.

As described above, according to the second embodiment, the relay 41 is constructed with the plate-shaped semiconductor switching devices 411 and 412, and the relay 42 is constructed with the plate-shaped semiconductor switching devices 421 and 422. The relays 41 and 42 are mounted on the first surface 11 of the board 10. Thus, the electronic control unit 1 can be reduced in height and size compared to that in the first embodiment. In addition, since the relays 41 and 42 are mounted on the first surface 11 of the board 10, the relays 41 and 42 are located close to the heatsink 70 so that the heat of the relays 41 and 42 can be efficiently transferred to the heatsink 70 through the heat-conducting member 80.

Further, since the power Zener diode 53 serving as a heat mass/capacity member is mounted near the relays 41 and 42, part of the heat of the relays 41 and 42 is transferred to the power Zener diode 53. Thus, the heat of the relays 41 and 42 can be transferred to the heatsink 70 through the power Zener diode 53 and the heat-conducting member 80.

(Modifications)

While the present disclosure has been described with reference to the embodiments, it is to be understood that the disclosure is not limited to the embodiments. The present disclosure is intended to cover various modifications and equivalent arrangements inside the spirit and scope of the present disclosure. For example, the embodiments can be modified as follows.

In the embodiments, the switching device 20 and the shunt resistor 52 are mounted on the first surface 11 of the board 10, and the capacitor 30, the relays 41, 42, and the coil 51 are mounted on the second surface 12 of the board 10. However, which of the high-heat generating devices are mounted on the first surface 11 or the second surface 12 of the board 10 are not limited to the embodiments. For example, the switching device 20 can be mounted on the first surface 11 instead of the second surface 12.

In the embodiments, all the high-heat-generating devices mounted on the board 10 are collectively arranged inside the first limited region T1 or the second limited region T2. In other words, the ratio of the number of all the high-heat-generating devices mounted on the board 10 to the number of the high-heat-generating devices arranged inside the first limited region T1 or the second limited region T2 is 1. However, some of the high-heat-generating devices can be arranged outside the first limited region T1 and the second limited region T2 so that the ratio can be not less than the predetermined value.

In the embodiments, the motor 101 is a brushed motor and driven by the H-bridge circuit constructed with the four switching devices 21-24. Alternatively, the motor 101 can be a brushless motor and driven by an inverter controlled by the controller 60. The inverter is constructed with the same number of switching pairs as the phases of the brushless motor. Each switching pair has a high-potential-side switching device and a low-potential-side switching device. For example, when the motor 101 is a three-phase brushless motor, the inverter can be constructed with three switching pairs, i.e., six switching devices. In this case, the motor 101 can be provided with two inverters (i.e., twelve switching devices in total) which are connected in a redundant configuration. In such an approach, even if one inverter is broken, the motor 101 can be driven by the other inverter. That is, the present disclosure can be applied regardless of the number of the switching devices (i.e., high-heat-generating devices) and also regardless of whether the motor 101 is a brushed motor or a brushless motor.

In the embodiments, the heat-conducting member 80 is in contact with both the board 10 and the heatsink 70. However, it is not always necessary that the heat-conducting member 80 is in contact with the board 10 as long as the heat-conducting member 80 is in contact with the high-heat conducting devices and the heatsink 70.

In the embodiments, multiple heat-conducting members 80 are integrated as one heat-conducting member 80. Alternatively, each of the heat-conducting members 80 can be individually provided to the corresponding high-heat generating device. Alternatively, the heat-conducting members 80 can be divided into groups, and the heat-conducting members 80 belonging to the same group can be integrated as one heat-conducting member 80. It is not always necessary that all the high-heat generating devices are provided with the heat-conducting member 80.

In the embodiments, the heat-conducting member 80 includes both the heat-dissipating sheet 81 and the heat-dissipating grease 82. Alternatively, the heat-conducting member 80 can include only one of the heat-dissipating sheet 81 and the heat-dissipating grease 82.

In the embodiments, the controller 60 is arranged outside the first limited region T1 of the first surface 11 and the second limited region T2 of the second surface 12 of the board 10. Alternatively, the controller 60 can be arranged inside the first limited region T1 or the second limited region T2. In such an approach, the heat of the controller 60 can be transferred to the heatsink 70 through the same path as the heat of the high-heat generating devices.

In the embodiments, the heights of all the high-heat generating devices mounted on the first surface 11 of the board 10 is equal to or less than the predetermined height value h1. Alternatively, the height of at least one of the high-heat generating devices mounted on the first surface 11 of the board 10 can be greater than the predetermined height value h1.

In the embodiments, the high-heat generating devices mounted on the first surface 11 of the board 10 are shaped like a rectangular plate. However, the high-heat generating devices mounted on the first surface 11 of the board 10 can be any shape including a polygonal or circular plate and a polygonal or circular column.

In the embodiments, the heights of at least one of the high-heat generating devices mounted on the second surface 12 of the board 10 is equal to or greater than the predetermined height value h2. Alternatively, the height of at least one of the high-heat generating devices mounted on the second surface 12 of the board 10 can be less than the predetermined height value h2.

In the embodiments, the switching device 20, the capacitor 30, the relays 41, 42, the coil 51, and the shunt resistor 52 are described as high-heat-generating devices which generate heat greater than the predetermined heat value when the electronic control unit 1 operates. It is not always necessary that the high-heat-generating devices include all of the switching device 20, the capacitor 30, the relays 41, 42, the coil 51, and the shunt resistor 52.

In the embodiments, the power Zener diode 53 is described as a low-heat-generating device which is arranged near the high-heat-generating device mounted on the board 10 and generates heat not greater than the predetermined heat value when the electronic control unit 1 operates. Alternatively, a device having a volume greater than the predetermined volume value and having a thermal conductivity greater than a predetermined conductivity value can be used as the low-heat-generating device. For example, a device shaped like a chip and made of a material having thermal conductivity greater than the predetermined conductivity value, such as copper, silver, aluminum, iron, and carbon, can be used as the low-heat-generating device.

In the embodiments, the ignition power source 106 is electrically connected to the node between the relay 41 and the coil 51. The controller 60, i.e., the microcomputer 61 and the custom IC 62 operate on power from the ignition power source 106. Alternatively, the ignition power source 106 can be electrically connected to the opposite side of the relay 41 from the coil 51 or connected to the opposite side of the coil 51 from the relay 41.

In the embodiments, the high-heat-generating device and the low-heat-generating device are surface-mount devices (SMDs). Alternatively, at least one of the high-heat-generating device and the low-heat-generating device can be a through-hole device (THD).

In the embodiments, four switching devices 20 (i.e., 21-24) and three capacitors 30 (i.e., 31-33) are used to energize the motor 101. The number of the switching devices 20 and the number of the capacitors 30 can be any numbers.

In the embodiments, the board 10 is fixed to the heatsink 70 by screws as the fasteners 2. Alternatively, the board 10 can be fixed to the heatsink 70 by a press-fit joint, a nut-and-bolt joint, a snap-fit joint, etc.

In the embodiments, the capacitor 30 is an aluminum electrolytic capacitor. However, the capacitor 30 can be any type of capacitor such as a conductive polymer capacitor or a hybrid capacitor.

In the embodiments, the electronic control unit 1 is a separate piece of the motor 101 as a control target. Alternatively, the electronic control unit 1 can be integrated with the motor 101. In this case, the heatsink 70 can be integrated with an end of a frame of the motor 101. In such an approach, the number of parts in the electric power steering apparatus 100 is reduced, and accordingly the size of the electric power steering apparatus 100 is reduced.

In the embodiments, the electronic control unit 1 is used in the electric power steering apparatus 100. Alternatively, the electronic control unit 1 can be used to control a motor or the like of an apparatus other than the electric power steering apparatus 100.

Such changes and modifications are to be understood as being inside the scope of the present disclosure as defined by the appended claims.

What is claimed is:

1. An electronic control unit for controlling a control target, the electronic control unit comprising:
    a board having a first surface and a second surface opposite to the first surface;
    a power Zener diode that is mounted on the first surface of the board;
    a plurality of high-heat-generating devices, wherein:
        each of the plurality of high-heat-generating devices generates heat, an amount of which is greater than an amount of heat generated from the power Zener diode, when the electronic control unit operates to control the control target;
        the plurality of high-heat-generating devices includes a first high-heat-generating device mounted on the first surface of the board and a second high-heat-generating device mounted on the second surface of the board; and
        the first high-heat-generating device is a switching device;
    a controller that controls the control target by controlling at least one of the plurality of high-heat-generating devices;
    a heat-dissipating member located facing the first surface of the board; and
    a heat-conducting member located between the first surface of the board and the heat-dissipating member, wherein:
    the first surface and the second surface include a first limited region and a second limited region, respectively, which are opposed to each other in a direction perpendicular to a plane of the board and are placed in an extent of the heat-conducting member in the plane of the board;
    the switching device mounted on the first surface is located in the extent of the heat-conducting member in the plane of the board in the first limited region to transfer the heat of the switching device mounted on the first surface to the heat-dissipating member through the heat-conducting member;
    the second high-heat-generating device mounted on the second surface is located in the extent of the heat-conducting member in the plane of the board in the second limited region to transfer the heat of the second high-heat-generating device mounted on the second surface to the heat-dissipating member through the board and the heat-conducting member;
    the power Zener diode is arranged near the switching device in the first limited region to serve as a heat mass;
    when a power, which is supplied from a power source to the electronic control unit, is larger than a threshold, the power Zener diode enables an electric current to flow from the power source to a ground through the power Zener diode to limit conduction of the electric current from the power source to the electronic control unit; and
    when the power, which is supplied from the power source to the electronic control unit, is not larger than the threshold, the power Zener diode prevents the electric current from flowing from the power source to the ground through the power Zener diode to enable conduction of the electric current from the power source to the electronic control unit and absorb some of the heat generated from the switching device.

2. The electronic control unit according to claim 1, wherein
    the heat-conducting member is in contact with the board and the heat-dissipating member.

3. The electronic control unit according to claim 1, wherein
    the controller is mounted on the first surface or the second surface of the board and arranged outside the first limited region and the second limited region.

4. The electronic control unit according to claim 1, wherein
    the controller is mounted on the first surface or the second surface of the board and arranged inside the first limited region or the second limited region.

5. The electronic control unit according to claim 1, wherein
    in the direction perpendicular to the plane of the board, the power Zener diode mounted on the first surface has a height that is less than a height of the second high-heat-generating device mounted on the second surface.

6. The electronic control unit according to claim 1, wherein
the power Zener diode mounted on the first surface is planar.

7. The electronic control unit according to claim 1, wherein
the second high-heat-generating device mounted on the second surface is one of a capacitor, a relay, and a coil.

8. The electronic control unit according to claim 1, wherein the switching device mounted on the first surface is one of a plurality of switching devices mounted on the first surface in the first limited region to control an electric current supplied to the control target.

9. The electronic control unit according to claim 1, wherein the second high-heat-generating device mounted on the second surface is a capacitor.

10. The electronic control unit according to claim 1, wherein the heat-dissipating member is a single heat-dissipating member provided in the electronic control unit.

11. An electric power steering apparatus for a vehicle comprising:
the electronic control unit as defined in claim 1, and
wherein the control target is controllable by the electronic control unit and capable of producing assisting-torque to help a driver to steer the vehicle.

* * * * *